(12) United States Patent
Hayasaki et al.

(10) Patent No.: US 6,686,130 B2
(45) Date of Patent: Feb. 3, 2004

(54) PATTERN FORMING METHOD USING PHOTOLITHOGRAPHY

(75) Inventors: Kei Hayasaki, Kamakura (JP); Shinichi Ito, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 250 days.

(21) Appl. No.: 09/893,485

(22) Filed: Jun. 29, 2001

(65) Prior Publication Data

US 2002/0015904 A1 Feb. 7, 2002

(30) Foreign Application Priority Data

Jun. 30, 2000 (JP) ........................................ 2000-200121

(51) Int. Cl.⁷ ............................. G03F 7/00; H01L 21/00
(52) U.S. Cl. ..................... 430/322; 430/30; 430/312; 430/328; 216/83; 216/84; 216/85
(58) Field of Search ..................... 430/30, 312, 328, 430/322; 216/83, 84, 85

(56) References Cited

U.S. PATENT DOCUMENTS

| | | | |
|---|---|---|---|
| 4,647,172 A | 3/1987 | Batchelder et al. | 354/298 |
| 4,851,311 A | 7/1989 | Millis et al. | 430/30 |
| 4,998,021 A | 3/1991 | Mimasaka | 250/560 |
| 5,427,878 A | 6/1995 | Corliss | 430/30 |
| 5,898,478 A * | 4/1999 | Yim et al. | 430/22 |
| 5,977,558 A * | 11/1999 | Lee | 257/48 |
| 6,187,488 B1 | 2/2001 | Hayasaki et al. | 430/30 |
| 6,191,397 B1 | 2/2001 | Hayasaki et al. | 219/497 |
| 6,238,936 B1 * | 5/2001 | Yu | 438/7 |
| 6,251,544 B1 | 6/2001 | Inoue et al. | 430/5 |

FOREIGN PATENT DOCUMENTS

JP 2818689 8/1998

OTHER PUBLICATIONS

Fujisawa et al.; "Control Method for Exposure Apparatus and Control Method for Semiconductor Manufacturing Apparatus" U.S. patent application Ser. No. 09/671,502, filed on Sep. 27, 2000, U.S. Pat. 6,376,139.

Hayasaki et al.; "Pattern Siz e Evaluation Apparatus", U.S. patent application Ser. No. 09/030,510, filed on Feb. 25, 1998, U.S. Pat. 6,423,977.

* cited by examiner

Primary Examiner—Mark F. Huff
Assistant Examiner—Kripa Sagar
(74) Attorney, Agent, or Firm—Finnegan, Henderson, Farabow, Garrett & Dunner, L.L.P.

(57) ABSTRACT

In the light exposure step of the device pattern, the monitor region is exposed to light together with the device region for every chip, and chip ④ within the wafer, the chip ④ having the focus conditions in the light exposure step close to a set value and having an average value of the dose, is extracted after the light exposure of the device pattern and before the developing treatment. The monitor region arranged within the extracted chip ④ is irradiated with light during the development of the resist, and the stopping time of the development for finishing the device pattern in a desired size is estimated on the basis of the change in the intensity of the reflected light of the monitor region. Further, a developing solution is supplied onto the wafer during the estimated stopping time of the development so as to stop the development.

23 Claims, 13 Drawing Sheets

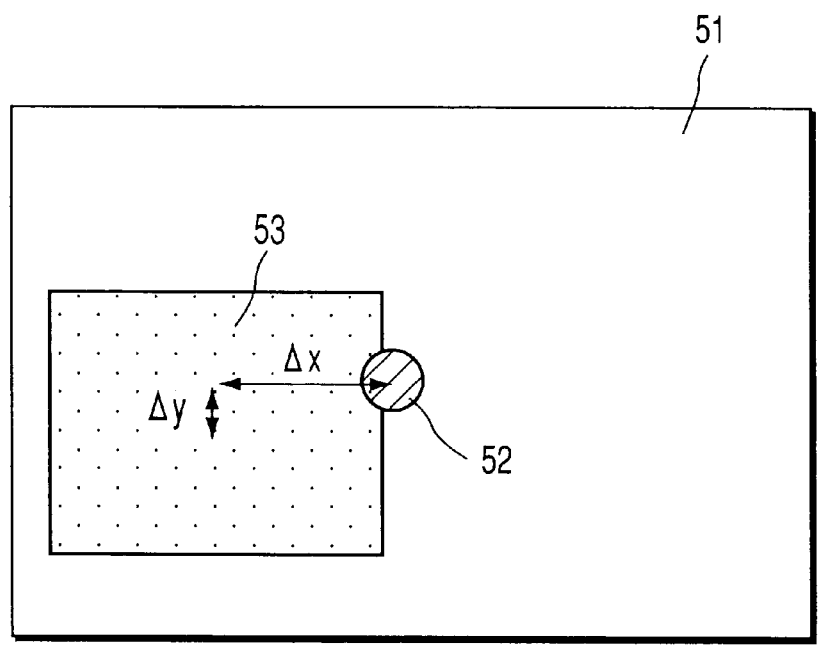
F I G. 3A
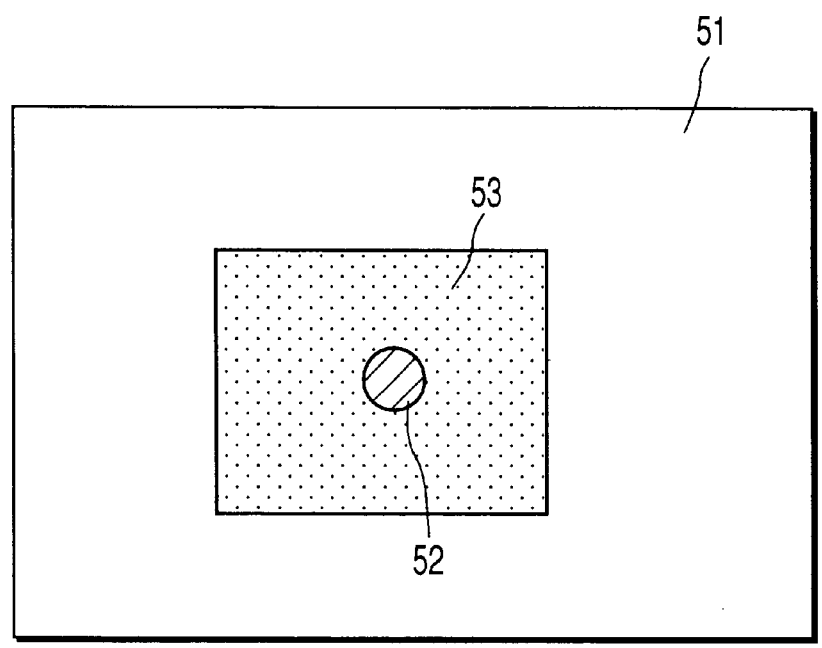
F I G. 3B

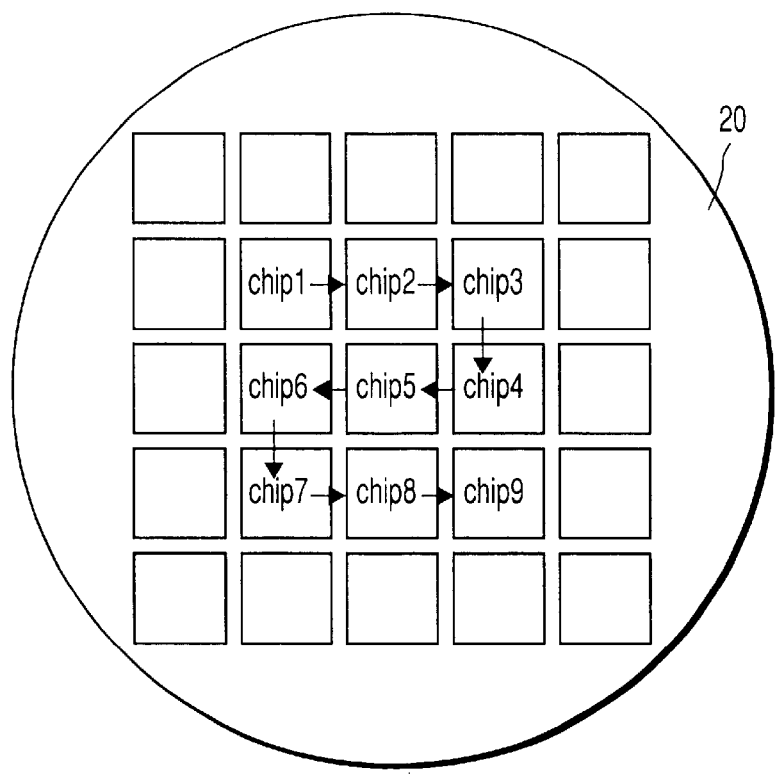
F I G. 4
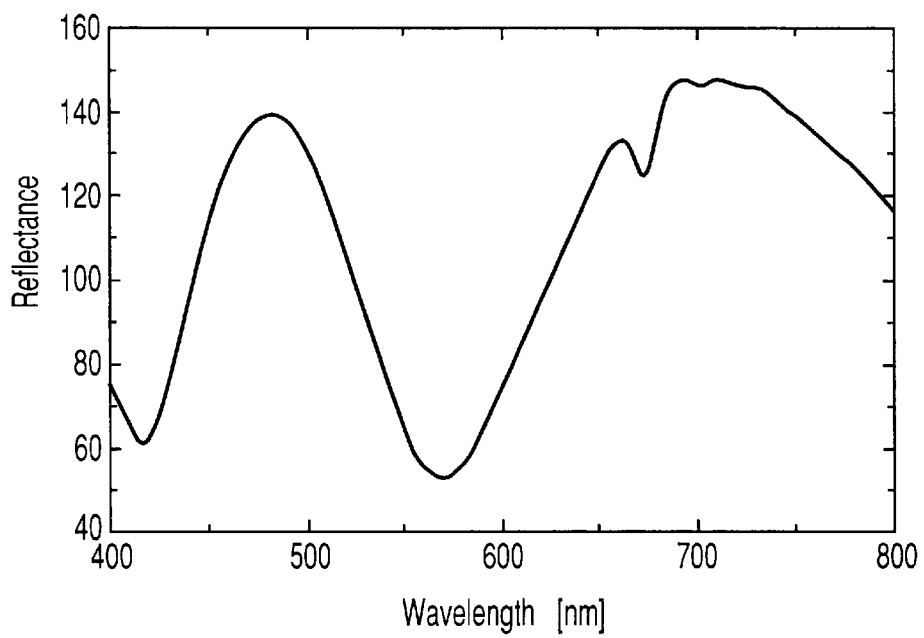
F I G. 5

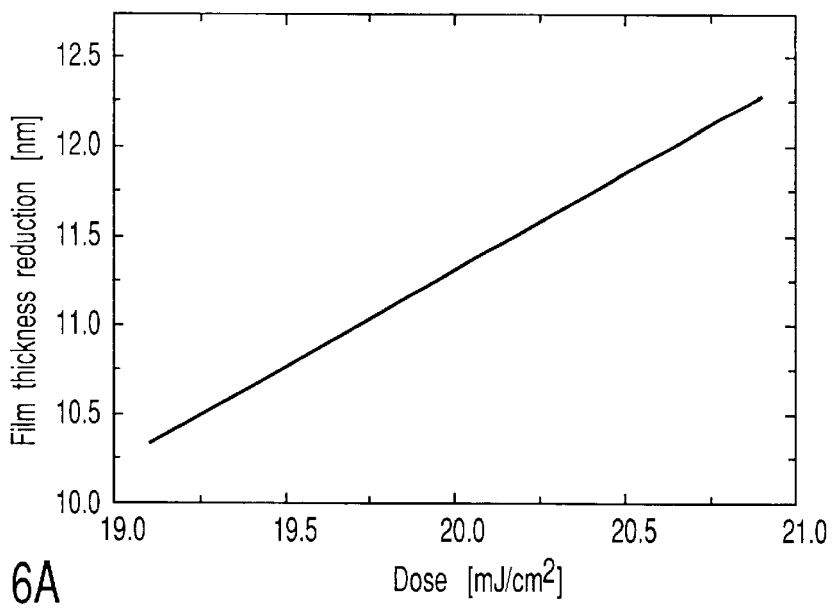
FIG. 6A
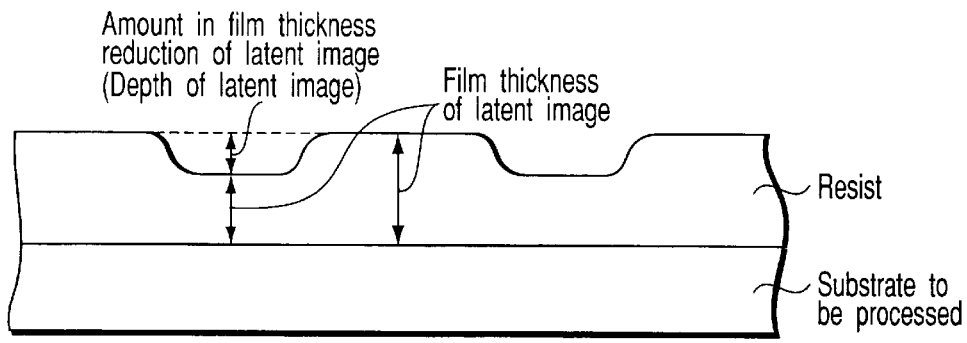
FIG. 6B
| chip No. | Film thickness of latent image [nm] |
|---|---|
| 1 | Excluded from object |
| 2 | 11.5 |
| 3 | 11.8 |
| 4 | 11.3 |
| 5 | Excluded from object |
| 6 | 11.4 |
| 7 | 11.6 |
| 8 | 11.2 |
| 9 | 11.5 |
| Average | 11.5 |
FIG. 7

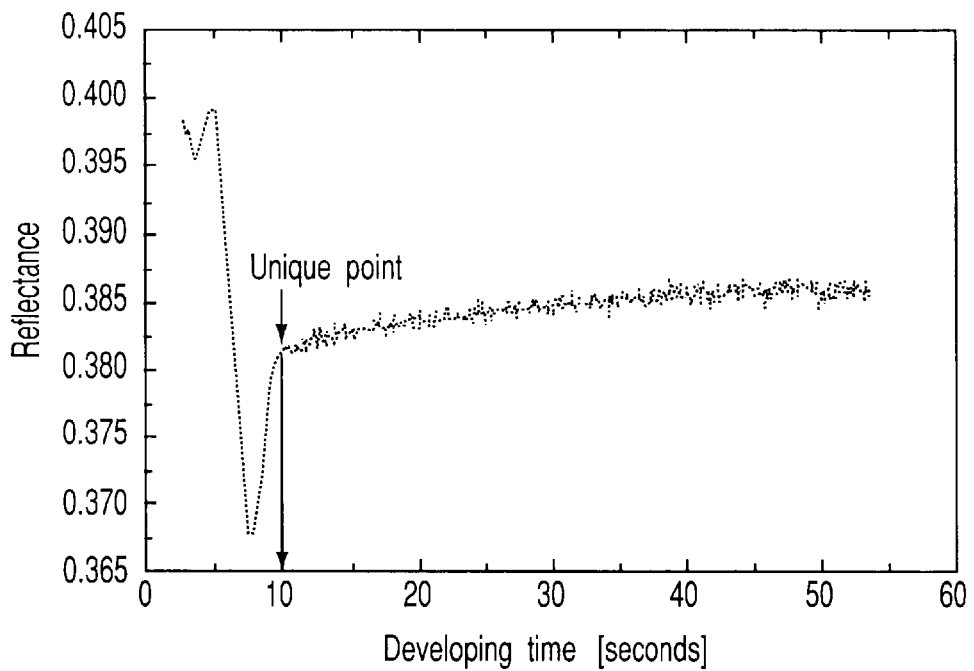
F I G. 8
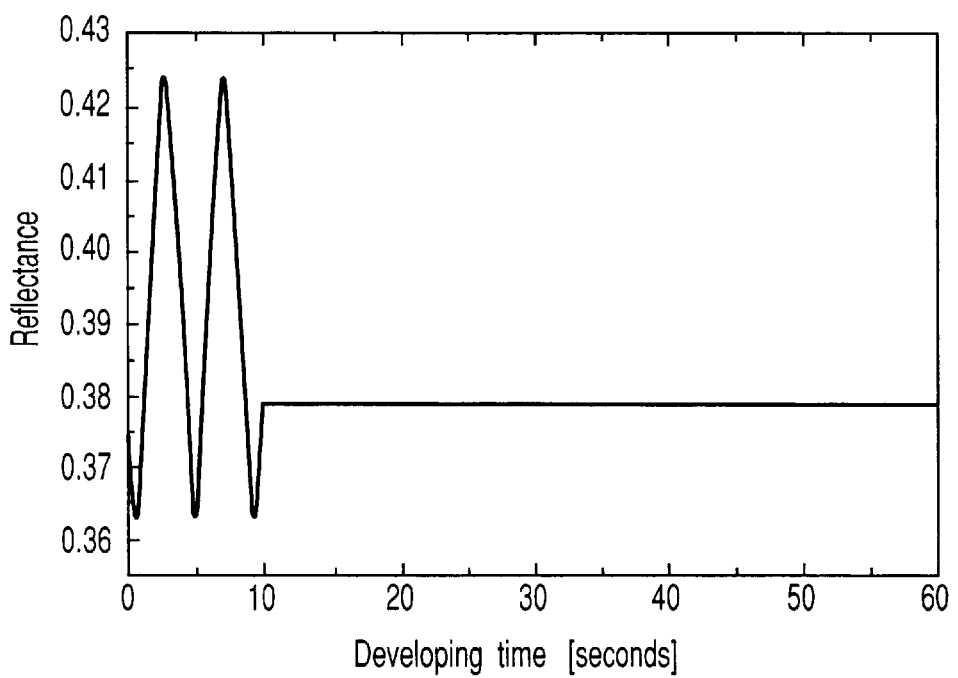
F I G. 9

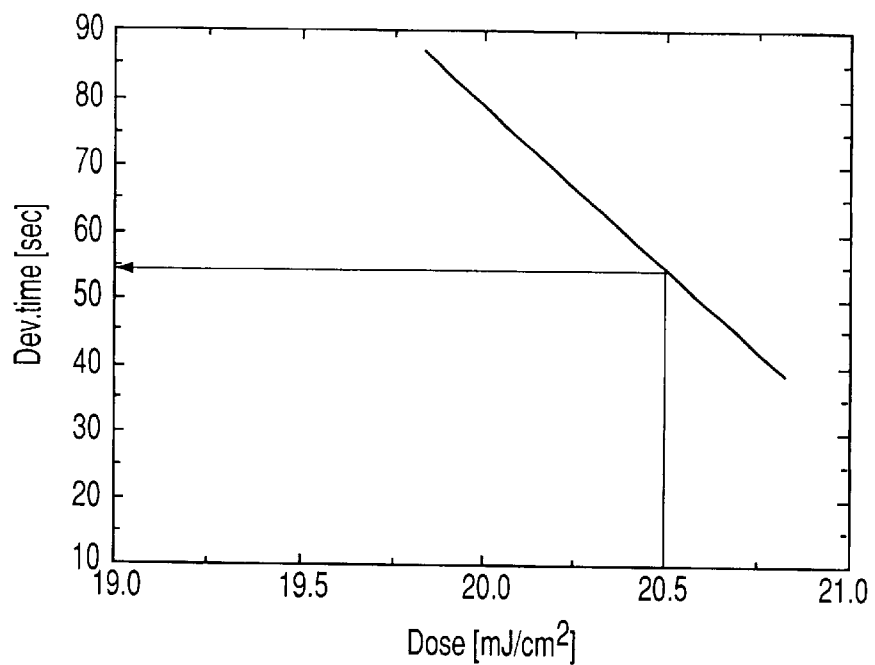
F I G. 12
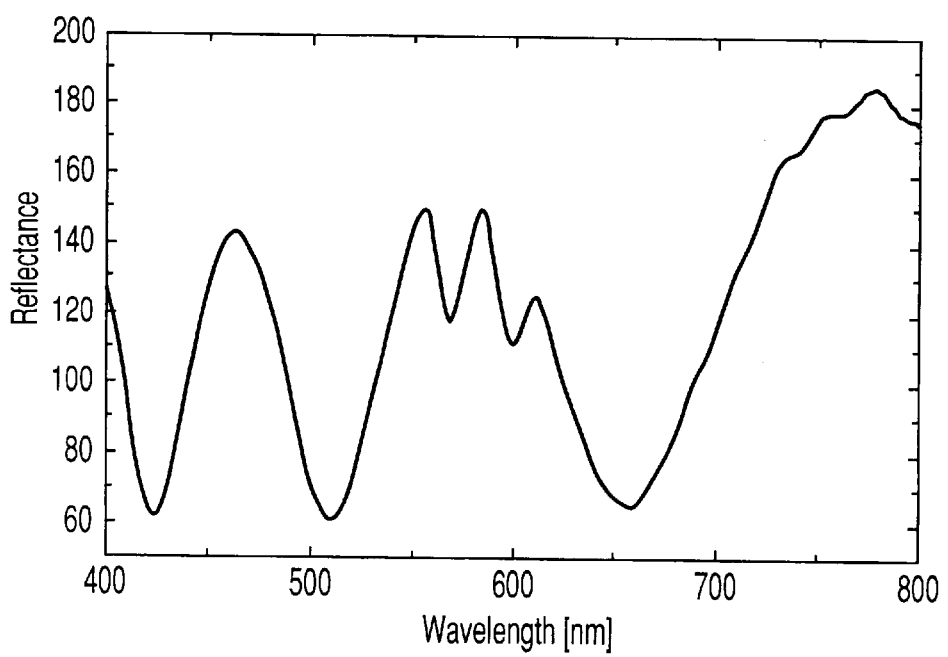
F I G. 13

| chip No. | Film thickness of latent image [nm] |
|---|---|
| 1 | 11.4 |
| 2 | Excluded from object |
| 3 | 11.8 |
| 4 | 11.3 |
| 5 | Excluded from object |
| 6 | 11.3 |
| 7 | 11.2 |
| 8 | 11.2 |
| 9 | Excluded from object |
| Average | 11.4 |
F I G. 14
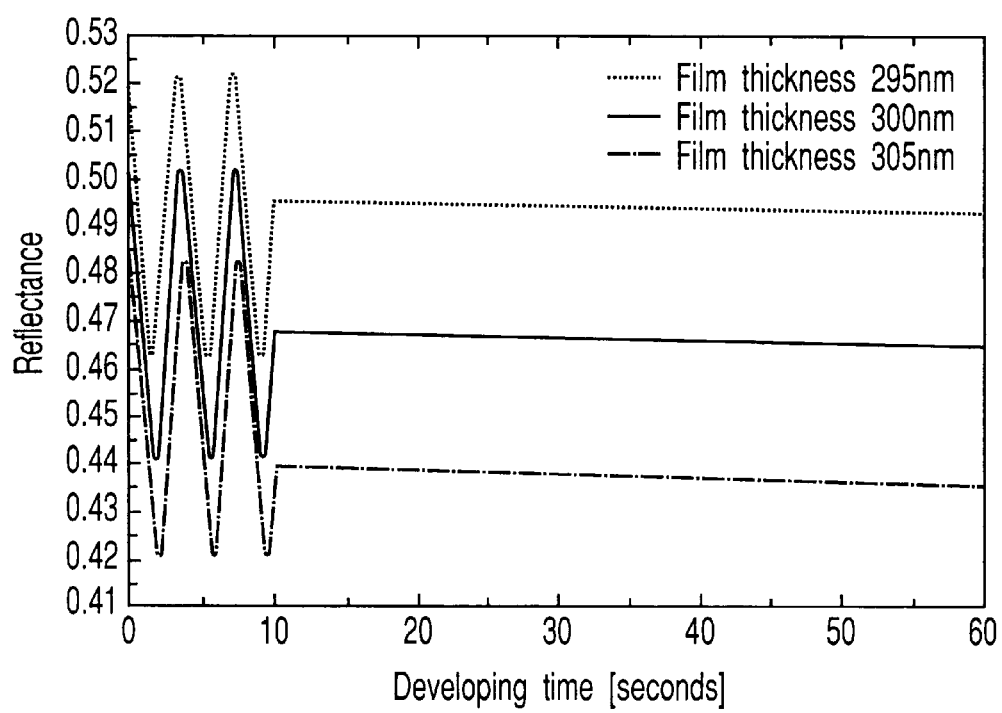
F I G. 15

PATTERN FORMING METHOD USING PHOTOLITHOGRAPHY

CROSS-REFERENCE TO RELATED APPLICATIONS

This application is based upon and claims the benefit of priority from the prior Japanese Patent Application No. 2000-200121, filed Jun. 30, 2000, the entire contents of which are incorporated herein by reference.

BACKGROUND OF THE INVENTION

The present invention relates to a pattern forming method for forming a resist pattern by photolithography on a target substrate in the manufacture of a semiconductor device, particularly, to a pattern forming method in which the terminal point of the development is judged while monitoring a monitoring region in the developing step of a resist pattern.

Known is a method of controlling the developing time in the developing step on the basis of the result of the monitoring of a monitoring region formed separately from a device pattern in order to reduce the nonuniformity in size among the wafers. In this method, a monitoring region arranged in a specified chip of a wafer is monitored. Therefore, where the chip under monitoring is under unique conditions because of some causes and not processed under average conditions, the size of the chip that is not monitored is not finished at the desired size, though the size of the chip that is monitored is finished at the desired value, with the result that the average size of the wafers greatly deviates.

The present inventors have already proposed a method in order to overcome this problem. In the method previously proposed by the present inventors, latent images of a monitoring region in some chips before developing are monitored, and the chip which is processed under average conditions is extracted from among the chips. Also, the monitoring region of the extracted chip is monitored during the developing treatment so as to finish the developing treatment with an optimum developing time. In this method, however, it is impossible to obtain a sufficient accuracy in the case where the thickness of the underlying film fluctuates. Also, since the amount of change of the latent image of the monitoring region is monitored, it is impossible to consistently obtain chips which are processed under average conditions with a high accuracy if both the dose and the focus in exposure device fluctuate in the case that the monitoring region is affected by the focus fluctuation, e.g., a device pattern itself.

On the other hand, Japanese Patent No. 2818689 teaches a method that permits monitoring even where the thickness of the underlying film fluctuates. In this method, the final developing time and the dose are obtained from a unique point of the change in the intensity of the pattern such as maximum or minimum value in the change of the intensity. In recent years, however, the unique point in the change in the intensity of the pattern has come to be changed by not only the dose but also the fluctuation of the focus, in accordance with the miniaturization of the pattern size. Therefore, it is now impossible to obtain an optimum developing time from information of a unique point.

As described above, in the conventional method of controlling the developing time on the basis of monitoring of the monitoring region formed separately from the device pattern, a problem is generated in that the average size of the wafer greatly deviates in the case where the chip under monitoring is subject to unique of adverse conditions. Also, in the method of monitoring the latent image of the monitoring region for extracting the chip processed under average condition, it is impossible to obtain a sufficient accuracy in the case where the thickness of the underlying film fluctuates. In addition, in the case of a pattern in which the monitoring region is affected by the focus fluctuation, it is impossible to obtain a typical chip with a high accuracy if both the dose and the focus are fluctuated. Further, in accordance with the miniaturization of the pattern size, it is now impossible to obtain the optimum developing time from information on the unique point in the change in the intensity of the reflected light of the pattern.

BRIEF SUMMARY OF THE INVENTION

According to a first aspect of the present invention, there is provided a pattern forming method, for forming a device pattern by exposing a resist film on a to-be-processed substrate by the mask including device pattern developing the exposed resist film for a certain period and forming a device pattern comprising the steps of:

exposing the resist film by the mask including the device pattern and a monitoring region for each chip;

extracting a chip exposed in the focus condition within a set value and in the average dose condition before the developing step;

irradiating the monitor region situated in the extracted chip with light during the developing step of the resist and estimating the development time when the size of device pattern has reached desired value on the basis of the intensity change of the reflected light of the monitor region; and supplying a stop solution onto the substrate in the estimated development time so as to stop the development.

According to a second aspect of the present invention, there is provided a pattern forming method, for forming a device pattern by exposing a resist film on a to-be-processed substrate by the mask including device pattern developing the exposed resist film for a certain period and forming a device pattern comprising the steps of:

exposing the resist film by the mask including the device pattern and a monitoring region for each chip;

irradiating the monitor region with light having a plurality of wavelengths during the development step of the resist and estimating the development time when the size of device pattern has reached desired value on the basis of the wavelength dispersion in the intensity of the reflected light of the monitor region; and supplying a stop solution onto the substrate in the estimated development time so as to stop the development.

According to a third aspect of the present invention, there is provided a pattern forming method, for forming a device pattern by exposing a resist film on a to-be-processed substrate by the mask including device pattern developing the exposed resist film for a certain period and forming a device pattern comprising the steps of:

exposing the resist film by the mask including the device pattern and a monitoring region for each chip;

irradiating the monitor region with a light having a plurality of wavelengths during the developing step of the resist, converting intensity change of the reflected light of the monitor region into a phase, and estimating the development time when the size of device pattern has reached desired value on the basis of the converted phase; and supplying a stop solution onto the substrate in the estimated development time so as to stop the development.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 3A is for explaining the position adjustment of a monitor head and shows the position of the monitor head before the adjustment;

FIG. 3B is for explaining the position adjustment of a monitor head and shows the position of the monitor head after the adjustment;

FIG. 4 is for explaining the scanning of the monitor head before the development;

FIG. 5 is a graph showing the relationship between the measured reflectance and the wavelength;

FIG. 6A is a graph showing the relationship between the dose and the reduction in the thickness of the latent image in the monitor region;

FIG. 6B shows the relationship between the reduction in the thickness of the latent image and the thickness of the latent image in the monitor region;

FIG. 7 is a table showing the result of measuring the reduction amount of the thickness of the latent image in the monitor region;

FIG. 8 is a graph showing experimental data on the relationship between the developing time and the reflectance of the monitor region;

FIG. 9 is a graph showing the calculated data on the relationship between the developing time and the reflectance of the monitor region;

FIG. 12 is a graph showing the relationship between the dose and the developing time to permit the pattern size to be finished at a desired value;

FIG. 13 is a graph showing the relationship between the measured reflectance and the wavelength;

FIG. 14 is a table showing the result of measuring the reduction amount of the thickness of the latent image in the monitor region;

FIG. 15 is a graph showing the change in reflectance of a 200 nm L/S pattern during the change in the thickness of the underlying film;

DETAILED DESCRIPTION OF THE INVENTION

Figure 1:
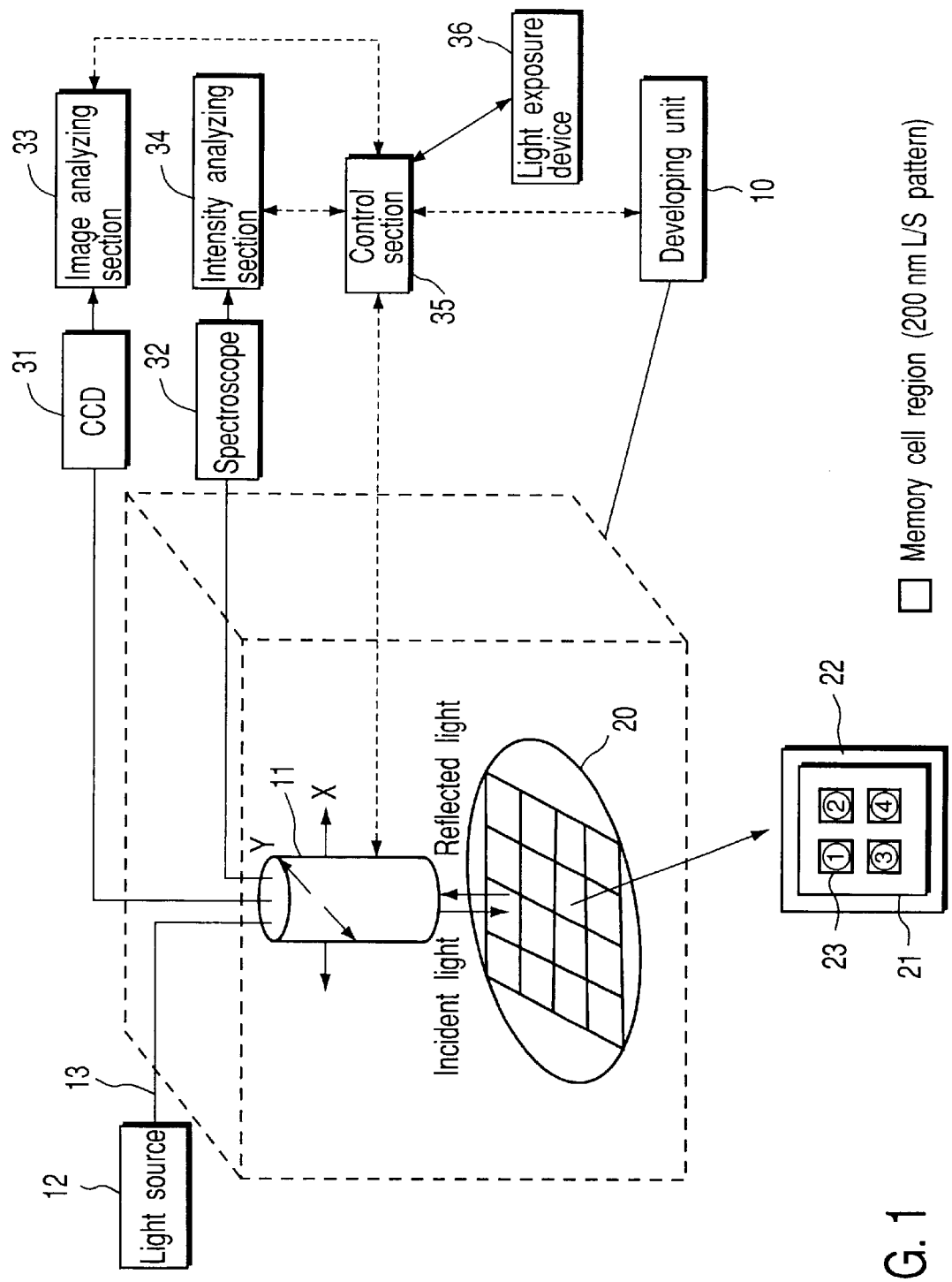
FIG. 1 schematically shows the construction of a developing device used in the method according to each embodiment of the present invention.

The present invention will now be described in detail with reference to the embodiments of the present invention shown in the drawings.

[First Embodiment]

In the actual lithography process, a film structure such as an oxide film is formed under a resist film and an antireflection film. In this embodiment, however, the underlying film is formed of silicon for the sake of brevity of the description. Where the underlying film is formed of silicon, the wafer is rendered highly flat. Therefore, the chip near the center of the wafer is exposed in the focus condition within a set value in a exposure device.

(Construction)

FIG. 1 schematically shows the construction of a developing apparatus used in the first embodiment of the present invention.

A monitor head 11 for performing the monitoring is arranged within a developing unit 10 together with the units required for performing the ordinary operations from the development to the rinsing. A light source 12, e.g., a halogen lamp, for outputting a probing light is connected to the monitor head 11 via an optical fiber 13. In this embodiment, since measurement is performed over a wavelength range of between 400 and 800 nm, it is desirable to use a light source 12 having a broad wavelength dispersion within this range. A CCD camera 31 is arranged in the monitor head 11 and a spectroscope 32 is connected to the monitor head 11 via an optical fiber 13.

In the developing apparatus of the construction described above, the light is guided from the halogen lamp used as the light source 12 into the optical fiber 13, and a lens arranged in the monitor head 11 permits the wafer to be irradiated with the guided light. The light reflected from the wafer 20 is divided by a half mirror arranged within the monitor head 11 into light beams incident on the CCD camera 31 and the spectroscope 32. Among these divided light beams, the light beam forming an image on the CCD camera 31 is analyzed by an image analyzing section 33 and used for detecting the position. Also, the other light beam is guided into the spectroscope 32 via the fiber 13 and is analyzed by an intensity analyzing section 34 so as to be used for obtaining the wavelength dispersion of the reflected light intensity (reflectance).

The monitor head 11 can be scanned in XY directions on the wafer 20 by a signal from a control section 35 so as to monitor the monitor region arranged within each chip on the wafer 20. As a result, the monitor head 11 is moved to a position where the monitor region of a specified chip can be detected on the basis of the layout of a mask and the shot map of exposure. Then, an image is obtained by the CCD camera, and the obtained image is transferred to an image analyzing section 33. In the image analyzing section 33, it is judged whether or not the region measured by the spectroscope 32 is coincident with the monitor region, e.g., cell memory region. Where these two regions are not coincident, the monitor head 11 is moved to permit these two regions to be coincident with each other.

As a reference image for judging whether or not the two regions are coincident with each other, it is possible to select the latent image of the resist of the layer under processing (image after the baking treatment performed after the exposure treatment). However, since the latent image is low in contrast, it is possible for the accuracy of the pattern matching to be lowered if the latent image is used as a reference image. Alternatively, it is possible that pattern matching will not be achieved. Under the circumstances, it is also possible to select the arrangement information of the underlying pattern of the resist under processing as a reference information for detecting the pattern position. In this case, the arrangement information of the pattern of the lower layer and upper layer (resist) are used as the reference information. The position of the monitor region of the resist pattern is detected from the result of the pattern matching of the reference information.

Mark regions 22 are arranged in the periphery of each chip on the wafer 20, and a device region 21 is arranged inside the mark region 22. A plurality of memory cell regions 23, e.g., L/S patterns of 200 nm, are arranged within the device region 21. The monitor region in this embodiment represents the memory cell region 23 within the device region 21. In this embodiment, the monitoring region use as the memory cell region 23, however, if the same pattern as the memory cell region is formed in the mark region 22, it is possible to use the mark region 22 as the monitoring region.

In this embodiment, the monitoring of the latent image before the development, the monitoring of the latent image during the development, and the measuring of the wavelength dispersion of the reflected light intensity of the monitor region are carried out by using the developing apparatus described above.

(Function)

Figure 2:
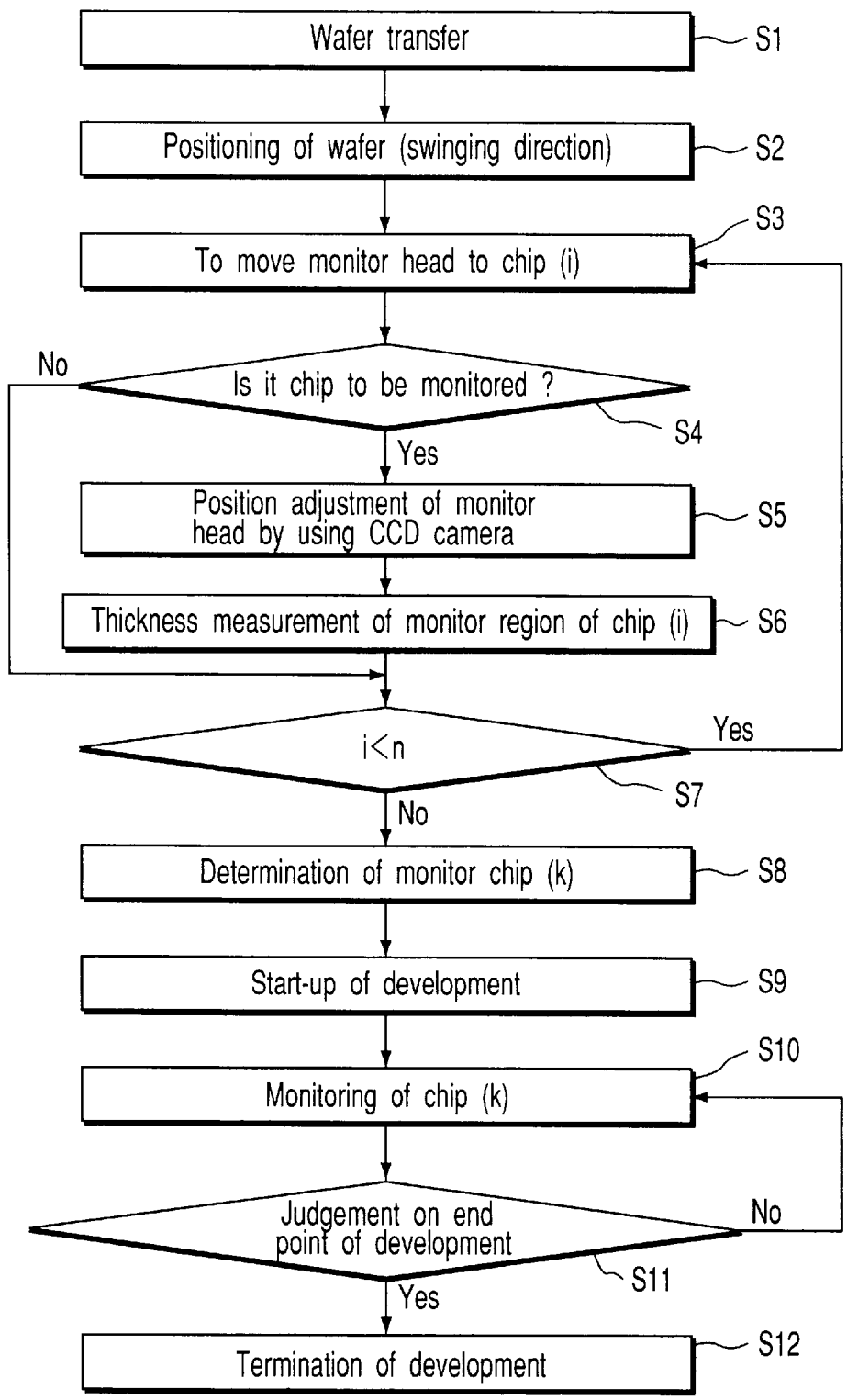
FIG. 2 is a flow chart showing the sequence of the monitor chip extraction and the development.

FIG. 2 shows the developing sequence in this embodiment. Steps S1 to S8 shown in FIG. 2 collectively denote the method of monitoring the latent image of the monitoring region before the development for extracting the monitor chip during development. Also, steps S9 to S12 denote the developing step in which the monitoring region in extracted chip is monitored and the development time is determined on the basis of the result of monitor. The developing method in this embodiment will now be described with reference to FIG. 2.

In the first step, both the device region and the monitor region are exposed for each chip of the wafer 20, followed by a baking treatment. Then, the wafer 20 is transferred into the developing unit 10 (step S1). Then, the position of the notch is detected so as to adjust the rotational position of the wafer 20 (step S2). Further, the monitor head 11 is moved to the monitor region of a specified chip (i) on the wafer 20 on the basis of the shot map during exposure and the layout of the exposure mask (step S3).

In this embodiment, nine chips in the central region of the wafer 20 shown in FIG. 4 are monitored. It should be noted that, if the chip exposed in the focus condition deviated from a set value is extracted, the extracted chip is net typical chip. Therefore, the deviation between the focus value of the monitor region and the set focus value is read on the basis of the focus information stored in the exposure apparatus 36 in the exposure step, and the chip having a value of deviation not larger than a predetermined value is extracted. In other words, the chip in which the focus condition deviates from a predetermined value is excluded from the object of the monitoring (step S4).

The specific method will now be described in respect of step S4. Specifically, when the chip is exposed in the exposure step, the exposure apparatus 36 sets the focus value by performing the leveling. In other words, the focus value is set such that the focusing is achieved in the position where the flatness is average. Therefore, it is desirable for the monitor region to be located in an average flatness position. Since it is highly possible for the average position to be located in a region in the vicinity of the center of the chip, the site of, for example, the memory cell region ④ within the device region 21 shown in FIG. 1 is used as the monitor region in this embodiment. Further, it is judged from the value of the interferometer of the light exposure apparatus 36 whether or not the flatness of the monitor region of the memory cell region ④ in the chips 1 to 9 has an average level. As a result, the chip having the flatness greatly deviating from the average level is excluded from the object of monitoring. In this embodiment, chips 1 and 5 among the nine chips failed to have an average level and, thus, were excluded from the chips that were monitored. Of course, it is possible to omit this step if the focus is not deviated from the set value.

Incidentally, in the general exposure device 36, the shape of the plane perpendicular to the scanning direction is detected while exposing a pattern and the scan exposure is performed while changing the focus in conformity with the portion having an average height. There is a so-called "leveling". The leveling information is stored in the exposure device 36. It follows that it is possible to know the focus conditions in the exposure step of each chip by referring to the leveling information stored in the exposure device 36.

The position adjustment of the monitor head (step S5) will now be described. FIG. 3A shows the observation area before the position adjustment after the monitor head is moved (step S3). Also, FIG. 3B shows the observation area after the position adjustment of the monitor head.

The optical system of the monitor head 11 is adjusted such that a region 52 detected by a spectroscope is positioned in the center of the view field 51 of the CCD camera. As shown in FIG. 3A, where the center of the monitor region 53 deviates from the center of the region 52 detected by the spectroscope, the intensity of the light reflected from the region other than the monitor region 53 is also detected, if the monitoring is performed under this state. Therefore, after the monitor head 11 is moved, the deviation amount ($\Delta x$, $\Delta y$) between the center of the monitor region 53 and the center of the region 52 detected by the spectroscope is obtained so as to move the monitor head 11 to the position shown in FIG. 3B. As a result, it is possible for the spectroscope 32 to detect the wavelength dispersion of the intensity of the light reflected from only the monitor region 53.

In the example described above, position adjustment is performed by using the CCD camera 31. However, where the monitor head 11 has a sufficient stage accuracy, it suffices to perform the position adjustment only once. If the position adjustment is once performed, it is unnecessary to perform adjustment later. Also, where the illuminating light passes through a narrow band filter to form a light having a substantially single color, it suffices to perform position detection by the pattern matching by using an image of the CCD camera 31 without measuring the intensity by the spectroscope 32 so as to detect the intensity of the reflected light having a gradation of CCD.

The thickness measurement of the monitor region (step S6) will now be described. FIG. 5 exemplifies the wavelength dispersion of the measured intensity of the reflected light. As shown in FIG. 5, the intensity of the reflected light is changed with the wavelength, and dispersion the intensity of the reflected light are determined by the thickness and the optical constant of the constituting film. It follows that it is possible to determine the film thickness by comparing the known wavelength dispersion of the intensity of the reflected light with the wavelength dispersion of the measured intensity of the reflected light.

FIG. 6A shows the relationship between the amount of thickness reduction of the latent image in the measured monitor region and the dose. If the amount of the thickness reduction of the monitor region is measured from the wavelength dispersion of the reflected light intensity described above, it is possible to know the dose with which the chip (i) under measurement is exposed.

FIG. 6B shows the relationship between the reduction amount of the latent image and the thickness of the latent image. As shown in FIG. 6B, if a baking treatment is performed after the resist on the substrate to be processed is exposed, formed is a latent image in which the resist layer is shrunk. The shrinkage amount is called the thickness reduction of the latent image. In other words, the amount of thickness reduction of the latent image represents the depth of the latent image.

Described above is the method of obtaining the amount of the thickness reduction of the monitor region from the wavelength dispersion of the intensity of the reflected light. Where the underlying layer of the antireflection film is flat, it is possible to obtain the amount of the thickness reduction of the monitor region from the intensity of the reflected light having a predetermined wavelength.

In this fashion, steps S4 to S6 are performed for each chip (i=1 to 9) on the wafer. These steps S4 to S6 are repeated while the number of times is equal to the number n of chips whose latent images are to be monitored, n being 9 in this embodiment, (step S7).

The extraction of the monitor chip (step S8) will now be described. FIG. 7 shows the result of measuring the thickness of the latent image of the monitor region. Since the focus conditions are deviated from the set values in chips 1 and 5 as described previously, these chips 1 and 5 are excluded from the object of monitoring. The result of measurement indicates that the average value in the reduction amount of film thickness of the monitor region is 11.5 nm. Therefore, chip 2 having a thickness of the average value is chosen as a monitor chip representing the wafer. In other words, chip 2 exposed in average dose condition is chosen.

If the chip to be monitored is determined, the developing treatment is started (step S9). To be more specific, developer is supplied, followed by moving the monitor head 11 to the chip, i.e., chip 2 in this case, extracted in step S8 so as to adjust the position. It is possible to start the developing treatment after moving the monitor head 11. Then, monitoring is started (step S10). For monitoring during the developing treatment, the wavelength dispersion of the intensity of the light reflected from the monitor region is measured during developing treatment as in the measurement of the thickness of the latent image.

The method of judging the termination of the developing treatment (step S11) will now be described on the basis of the intensity change during the actual developing treatment. Incidentally, the method will be described on the basis of the intensity change having a wavelength of 550 nm, though the changes in the intensity of the reflected light having a large number of wavelengths are measured simultaneously.

FIG. 8 is a graph showing experimental data in respect of the relationship between the developing time and the reflectance of the monitor region under the wavelength of 550 nm. On the other hand, FIG. 9 is a graph showing the result of calculation theoretically denoting the relationship shown in FIG. 8. Because of the change in the reflectance shown in FIG. 8, an interference change is observed in the initial stage of development, and a monotonous change in the intensity is observed in the latter stage of the development. The developing treatment causing the particular change in the reflectance to appear is carried out the logic computation under the conditions that the thickness of the film is reduced in the region of the light exposed portion (reduction of 190 nm) in the initial 10 seconds, the film is completely removed in the following 10 seconds, the development laterally proceeds at a rate of 2 nm per 10 seconds in the next stage and, then, a desired size (remaining size of 200 nm) is achieved in 60 seconds, as shown in FIG. 9. In other words, FIG. 8 shows that the film in the light-exposed portion is reduced in the initial period, and that the size is laterally changed in the latter stage.

Figure 10:
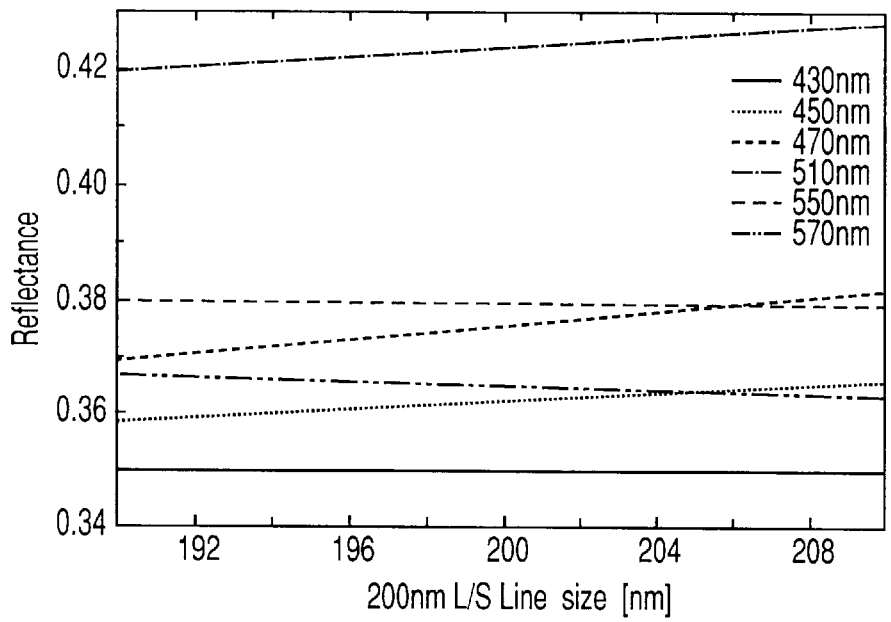
FIG. 10 is a graph showing the relationship between the 200 nm L/S line size and the reflectance.

FIG. 10 is a graph showing the relationship between the change in size in the lateral direction in the latter stage and the change in reflectance (change in the remaining size from 210 nm to 190 nm). In the graph of FIG. 10, the reflectance is measured for each of the wavelengths, and the pattern size is obtained from the reflectance. The time when the size has reached a predetermined value is regarded as the end point of development. However, since the amount of change in the reflectance relative to the size is very small in FIG. 10, it is possible that a very long time is required for the processing in order to obtain the size with a high accuracy from the reflectance calculated in respect of the wavelengths.

Since the lower layer of the antireflection film is formed of silicon in this embodiment, the reflectance is not affected by the lower layer. However, in practice, the lower layer is formed of an oxide film in some cases and, thus, the reflectance is greatly changed depending on the change in the thickness of the oxide film. It follows that it is highly possible for the processing to take further time.

Under the circumstances, the optimum developing time is obtained from the time of a unique point in the change of the intensity and from the reflectance at a specified developing time. The two amounts are measured in the present invention because there are two physical amounts, i.e., dose and focus, as factors for determining the size. Of course, where the value of focus is known by the exposure device 36, it is possible to measure any one of the unique point in the change of the intensity and the reflectance at the specified developing time. In general, as the accuracy of measuring the unique point in the change in intensity is higher, in the case of measuring only one of these two physical amounts, this method is preferred.

Since the lower layer of the antireflection film is formed of silicon in this embodiment, a chip failing to fall within the focus conditions is excluded from the object of monitoring on the basis of the information obtained from the light exposure device 36. It follows that, since it is known that the focus is aligned, only one physical amount is used as a factor for determining the size. To be more specific, the optimum developing time can be obtained from only the unique point in the change of intensity.

How to calculate the time providing the unique point in the change of the intensity will now be described. In order to detect the unique point in FIG. 8, it is sufficient to obtain the differentiated value in the change of intensity so as to obtain the time at which the differentiated value is not larger than a certain value. In this embodiment, since it is known that the lower layer of the antireflection film is formed of silicon, it is possible to obtain in advance the wavelength adapted for obtaining the unique point. Such being the situation, the unique point was obtained by using a wavelength of 550 nm. As a result, it has been found that the developing time forming the unique point is 10 seconds.

It should be noted that, in practice, since the lower layer is formed of, for example, an oxide film, it is impossible in some cases to know in advance the wavelength adapted for obtaining the unique point because of the change in film thickness. In such a case, the reflectance is measured for a plurality of wavelengths so as to extract the wavelength having a large change in the gradient in the vicinity of the unique point and to obtain the time at which the differentiated value of the change in the intensity is not larger than a certain value under the extracted wavelength. It is also possible for a plurality of wavelengths having a large change in the gradient in the vicinity of the unique point so as to obtain the unique point for each of these wavelengths so as to improve the accuracy in obtaining the unique point. In this case, it is possible to determine how many wavelengths can be analyzed by the process time.

Figure 11:
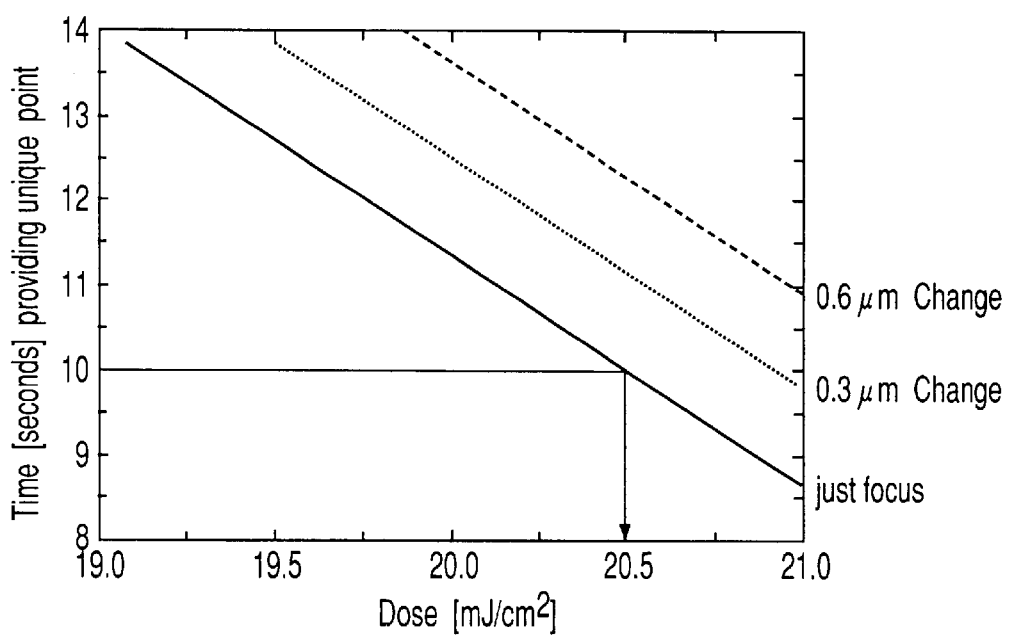
FIG. 11 is a graph showing the relationship between the dose and the time taken to reach a unique point in the case of changing the focus.

FIG. 11 is a graph showing the relationship between the dose and the time which constitute the unique point, covering the case where the focus fluctuates. In this embodiment, it is known that focus is achieved at step S4 and, thus, it is possible to know from the change in the intensity shown in FIG. 8 that the time that constitutes the unique point is 10 seconds. It follows that the dose of 20.5 mJ/cm$^2$ is obtained from the graph of FIG. 11.

FIG. 12 is a graph showing the relationship between the dose and the developing time. As shown in the graph of FIG. 12, the developing time is 54 seconds in the case where the dose is 20.5 mJ/cm$^2$. It follows that the development can be finished in 54 seconds (step S12).

(Effect)

As described above, in this embodiment, where the developing time is controlled in order to suppress the nonuniformity in the size of the wafers, that chip in the wafer which is processed under the typical conditions is extracted by the focus information in the exposure device 36 and by measuring the film thickness of the monitor region. By monitoring the change in the intensity of the monitor region of the chip during the development, it is possible to obtain the optimum developing time. As a result, it is possible to markedly suppress the nonuniformity of the size among the wafers so as to markedly improve the dimensional accuracy and the yield.

[Second Embodiment]

The second embodiment covers the case where the lower layer is formed of an oxide film (target of the film thickness being 300 nm). Therefore, the flatness of the wafer is not so high as in the first embodiment, and it is possible for even the chip positioned in a region close to the center of the wafer not to be exposed in substantially the focus amount set in exposure device.

(Construction)

The developing apparatus used in the second embodiment is substantially equal to that used in the first embodiment and, thus, is constructed as shown in FIG. 1. Therefore, the description of the developing apparatus is omitted in describing the second embodiment.

Also, the monitoring of the latent image before the development and the monitoring during the developing treatment are carried out in the second embodiment, too. Also, measured is the wavelength dispersion in the intensity of the reflected light of the monitor region.

(Function)

The developing sequence in the second embodiment is substantially equal to that in the first embodiment and, thus, is as shown in FIG. 2. The sequence from step S1 to step S5 for the second embodiment is exactly equal to that for the first embodiment and, thus, the description thereof is omitted. It should be noted, however, that, since chips 2, 5 and 9 among the 9 chips do not have an average level in step S4 of the second embodiment, these chips 2, 5 and 9 were excluded from the chips to be monitored.

The measurement of the film thickness of the monitor region (step S6) will now be described. FIG. 13 is a graph showing the wavelength dispersion in the measured intensity of the reflected light. As shown in FIG. 13, the reflected light intensity is changed for every wavelength, and the dispersion in the intensity of the reflected light is determined by the thickness and the optical constant of the constituting film. It follows that it is possible to obtain the film thickness by comparing the wavelength dispersion of the known intensity of the reflected light with the wavelength dispersion of the measured intensity of the reflected light.

FIG. 6A is a graph showing the relationship between the dose and the thickness reduction of the monitor region to be measured. If the amount of the thickness reduction of the monitor region is measured from the wavelength dispersion in the intensity of the reflected light noted above, it is possible to know the dose in exposing chip (i) to be measured.

In the method described above, the thickness reduction of the film of the monitor region is obtained from the wavelength dispersion in the intensity of the reflected light. However, where the lower layer of the antireflection film is flat, it is also possible to obtain the amount of the thickness reduction of the film of the monitor region from the intensity of the reflected light having a predetermined wavelength.

Steps S4 to S6 described above are applied to every chip (i=1 to) on the wafer. These steps S4 to S6 are performed by the number of times equal to the number n of the chips whose latent images are to be monitored (n being 9, n=9, in the second embodiment).

Then, the extraction of the monitor chip (step S8) will now be described. FIG. 14 is a table showing the result of measurement in the thickness of the latent image in the monitor region. Since the focus conditions of chips 2, 5 and 9 deviate from the set values as described previously, these chips 2, 5 and 9 are excluded from the objects of the monitoring. As shown in the table in FIG. 14, the average value in the reduction amount of film thickness of the monitor region was 11.4 nm. Therefore, chip 1 having the average value of the film thickness is chosen as a monitor chip representing the wafer.

If the chip to be measured is determined, the development is started (step S9). To be more specific, developer is supplied and, then, the monitor head 11 is moved to the chip extracted in step S8, i.e., chip 1, and the position is adjusted, followed by starting the monitoring (step S10). It is possible to start the developing treatment after moving the monitor head 11. During the developing treatment, the wavelength dispersion in the intensity of the reflected light from the monitor region is measured during developing treatment as in the step of measuring the film thickness of the latent image.

The method of judging the end point of the developing treatment (step S11) will now be described on the basis of the intensity change during the actual developing treatment. Incidentally, the changes in the intensity of the reflected light are simultaneously measured for a large number of wavelengths, and the following description is based on the intensity change having a wavelength of 550 nm among the large number of wavelengths.

FIG. 15 is a graph theoretically showing the relationship between the developing time under the wavelength of 550 nm and the reflectance of the monitor region. Also plotted in the graph of FIG. 15 is the intensity change in the case where the thickness of the underlying oxide film is changed within a range of ±5 nm about the central value of 300 nm.

The developing treatment that permits the change in the reflectance shown in FIG. 15 to appear is performed under the conditions that the thickness of the film is reduced in the region of the light exposed portion (reduction of 190 nm) in the initial 10 seconds, the film is completely removed in the following 10 seconds, the development laterally proceeds at a rate of 2 nm per 10 seconds in the next stage and, then, a desired size (remaining size of 200 nm) is achieved in 60 seconds, as shown in FIG. 15. The experimental data clearly support that, if the thickness of the underlying oxide film is changed, the reflectance is greatly changed.

Figure 16A:
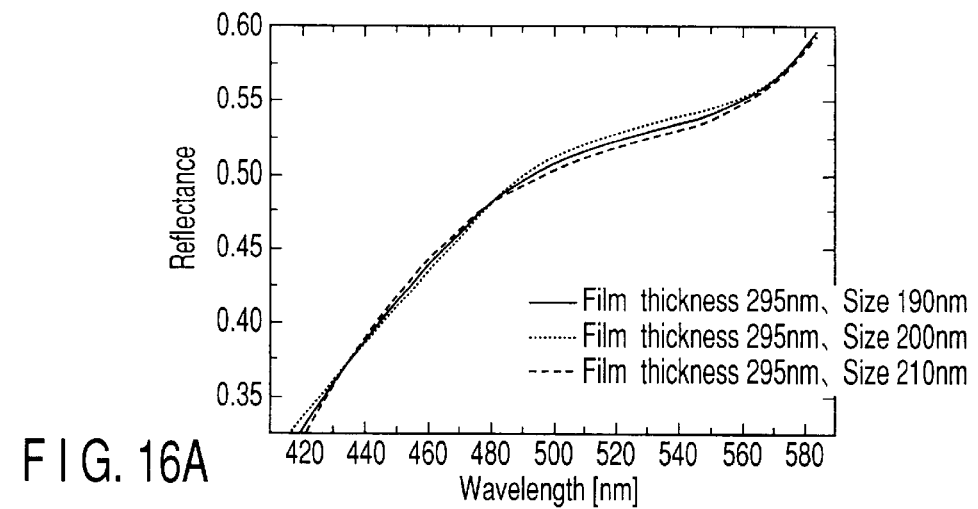
FIGS. 16A, 16B and 16C are graphs each showing the change of reflectance when the film thickness, the size and the wavelength are changed.
Figure 16B:
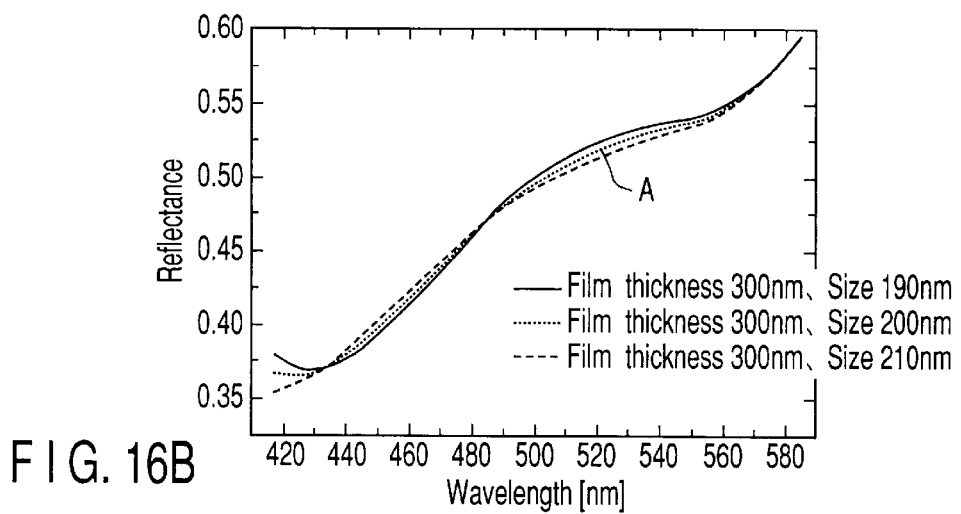
Figure 16C:
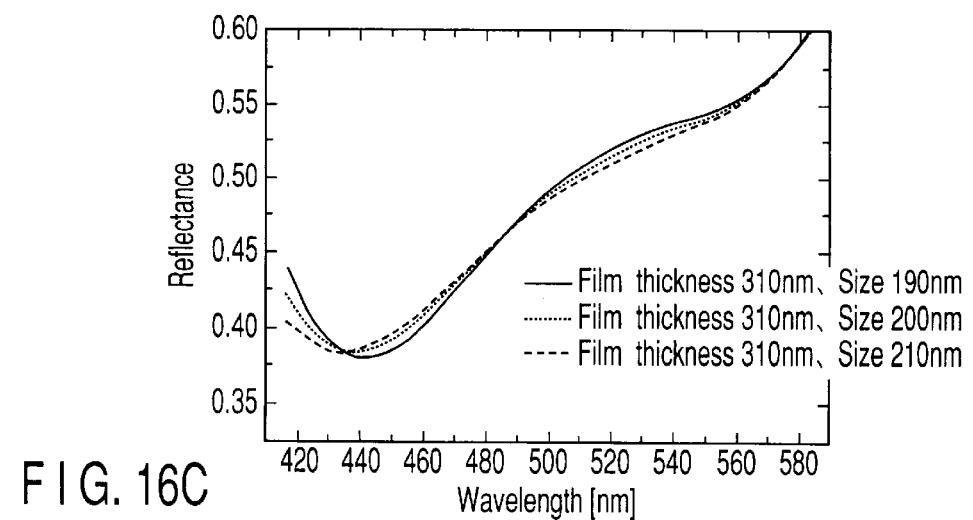

FIGS. 16A to 16C are graphs collectively showing the changes in the wavelength dispersion of the reflectance, covering the case where the film thickness and the size are changed. As is apparent from these graphs, the film thickness and size of the underlying layer are determined if the reflectance is calculated for every wavelength and the result of the calculation is fitted to the film thickness of the underlying layer and the pattern size. The time when the size has reached a predetermined value is regarded as the end point of the development.

To be more specific, suppose it has been judged that the thickness of the underlying film is, for example, 300 nm by detecting the intensity of each reflected light from the monitor region for a plurality of wavelengths and by performing the fitting by using the graphs of FIGS. 16A to 16C. In this case, the result of the measurement of the reflected light intensity at each wavelength is fitted with reference to FIG. 16B. If the required pattern size is, for example, 200 nm, the time when the reflectance coincides with curve A in each wavelength is judged to be the end point of the development. Incidentally, as apparent from FIGS. 16A to 16C, the change in the reflectance relative to the size is small. Therefore, the accuracy is lowered, if the size is judged from the change in the reflectance for a singe wavelength. However, it is possible to obtain a sufficient accuracy by the detection with a plurality of wavelengths.

It should be noted that the fitting treatment takes time in some cases. In such a case, it is possible to obtain the optimum developing time from the time providing the unique point in the change of the intensity and from the reflectance at a predetermined developing time. Also, it is possible to obtain the optimum developing time from the time providing the unique point in the change of the intensity and from the amount of change in the reflectance at a predetermined developing time. Two amounts are measured in this case because there are two physical amounts, i.e., the dose and the focus, as factors for determining the size. Of course, where the value of focus in the exposure device 36 is known, it is possible to measure only one of the unique point in the change of the intensity and the reflectance in a predetermined time. In general, the unique point in the change of intensity has a high measuring accuracy and, thus, it is desirable to measure the unique point in the change of the intensity in the case where only one of these physical factors is measured.

In the second embodiment, the lower layer of the antireflection film is formed of an oxide film and, thus, the exposure is not necessarily performed by the focus set by the light exposure device 36. It follows that the two physical amounts of the dose and the focus are required as the factors for determining the size. Under the circumstances, it measure not only the unique point in the change of the intensity but also the reflectance in a predetermined developing time (developing time of 30 seconds) and to obtain the optimum developing time from these two values.

How to calculate the time providing the unique point in the change of the intensity will now be described. In order to detect the unique point from the intensity change as shown in FIG. 15, the differentiated value in the change of the intensity is obtained so as to obtain the time when the differentiated value is not higher than a certain value. In the second embodiment, the lower layer of the antireflection film is formed of an oxide film and, thus, where the change in the thickness of the oxide film is large, it is impossible to determine the wavelength adapted for obtaining in advance the unique point. Such being the situation, the reflectance is measured for a plurality of wavelengths, and the wavelength having a large inclination in the vicinity of the unique point is extracted. Then, obtained is the time when the differentiated value in the change of the intensity is not larger than a predetermined value under the extracted wavelength. As a result, the time providing the unique point in the change of the intensity has been found to be 11 seconds. Also, it is possible to select a plurality of wavelengths having a large change in the inclination in the vicinity of the unique points and to obtain the unique point for each of these selected wavelengths so as to improve the accuracy of obtaining the unique point. In this case, it is determined what kinds of the wavelengths can be analyzed by the process time.

How to obtain the size from the reflectance at a predetermined developing time will now be described. In this case, the size was found to be 205 nm at the developing time of 30 seconds from the oxide film thickness and the wavelength dispersion of the size shown in FIGS. 16A to 16C, which are known in advance. As the predetermined developing time, 30 seconds was selected. It should be noted in this connection that, since it is known in advance that the time providing the unique point in the change of the intensity is less than 20 seconds, the process speed can be increased in the case where the processing that permits obtaining with a high accuracy the time providing the unique point is carried out for the initial 25 seconds and, then, the processing to obtain the size from the reflectance is carried out 30 seconds later. Such being the situation, it is desirable to set the specified time in view of these two processing times.

Also, if the optimum developing time obtain from the amount of change in the reflectance at a predetermined time, it is desirable to set the amount of change in the reflectance in a cross axle and to obtain the relationship between the reflectance and the dose and the focus.

Figure 17:
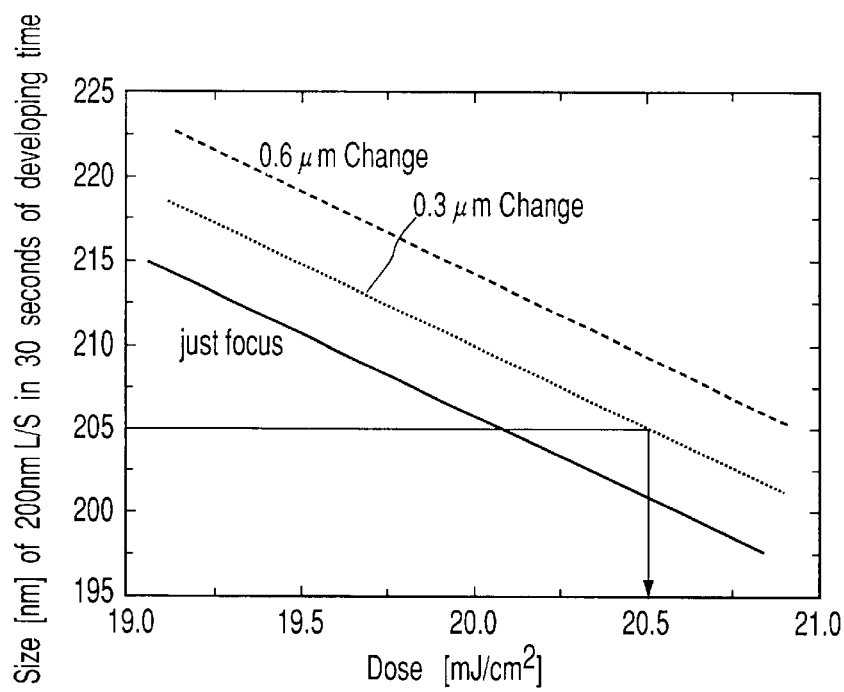
FIG. 17 is a graph showing the relationship between the dose and the size at 30 seconds of the developing time of 200 nm L/S.
Figure 18:
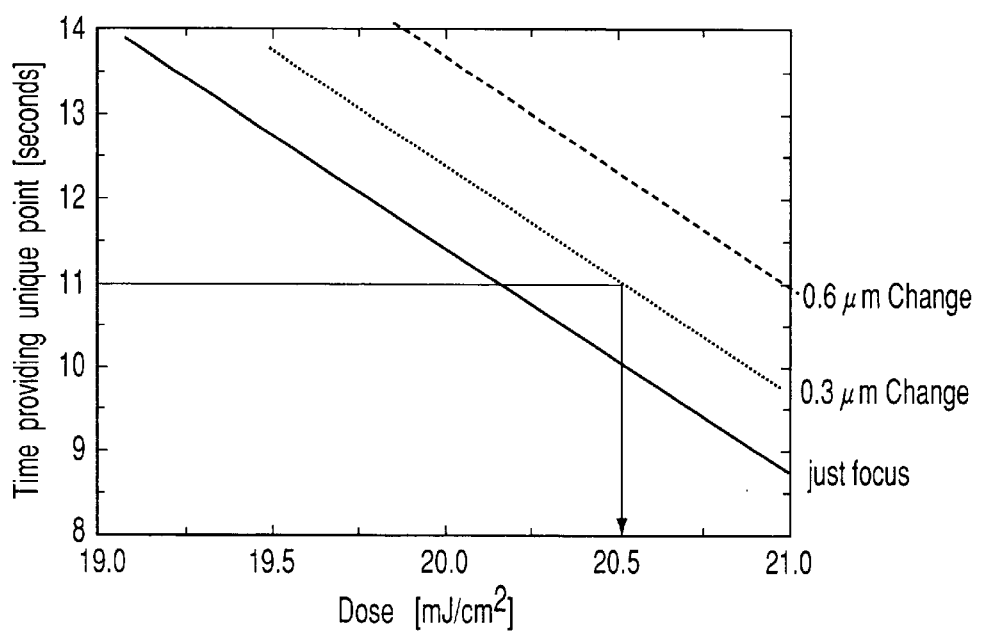
FIG. 18 is a graph showing the relationship between the dose and the time taken to form a unique point in the case where the focus is changed.

FIG. 17 is a graph showing the relationship between the dose and the size at the developing time of 30 seconds, covering the case where the focus is changed. On the other hand, FIG. 18 is a graph showing the relationship between the dose and the time providing the unique point, covering the case where the focus is changed.

As described above, the size at the developing time of 30 seconds was measured to be 205 nm, and the time providing the unique point was measured to be 11 seconds. Under the circumstances, the case is looked for where the dose in FIG. 17, where the size is 205 nm, coincides with the dose in FIG. 18, where the time providing the unique point is 11 seconds. As a result, the dose was measured to be 20.5 mJ/cm², and the focus was measured to be 0.3 µm.

The developing time is calculated form the dose and the focus noted above. The focus is basically set in a just state on the side of the exposure device 36. Therefore, since the region to be monitored is considered to be deviated, the developing time is obtained from the dose.

FIG. 12 is a graph showing the relationship between the dose and the developing time. The graph of FIG. 12 shows that, where the dose is 20.5 mJ/cm², the developing time is 54 seconds. It follows that the development is finished in 54 seconds (step S12).

(Effect)

As described above, in the second embodiment, that chip among the wafer which is processed under the typical conditions is extracted by the focus information and by measuring the film thickness of the monitor region in the case where the developing time is controlled in order to suppress the nonuniformity in the size among the wafer. Then, the development is started, and the time providing the unique point and the reflectance or the amount of change in the reflectance in a predetermined developing time are measured from the wavelength dispersion relative to the developing time, when the change in the intensity of the monitor region of the chip is monitored. As a result, it is possible to know both the dose and the focus amount, making it possible to obtain the optimum developing time conforming with these dose and the focus amount. It follows that it is possible to markedly decrease the nonuniformity in the size among the wafer and to markedly improve the accuracy of the size and the yield.

[Third Embodiment]

In the first embodiment, the end point of the development was determined from the reflectance. In the third embodiment, however, the change in the intensity of the reflected light is replaced by the phase, and the end point of the development is estimated from the phase.

(Construction)

The developing apparatus used in the third embodiment is equal to that used in the first embodiment and, thus, is constructed as shown in FIG. 1. Therefore, the detailed description of the developing apparatus is omitted.

In the third embodiment, the monitoring of the latent image before the development and the monitoring of the latent image during the development are carried out. Also, the wavelength dispersion in the intensity of the reflected light of the monitor region is measured. Also, in the monitoring during the developing treatment, the change in the intensity of the reflected light is converted into the phase, and the end point of the development is estimated from the phase.

(Function)

The developing sequence in the third embodiment is basically equal to that in the first embodiment and is as shown in FIG. 2. Steps S1 to S9 in the third embodiment are exactly equal to those in the first embodiment and, thus, the description thereof is omitted.

If the chip to be measured is determined by steps S1 to S8, the development is started (step S9). To be more specific, developer is supplied and, then, the monitor head 11 is moved to the chip determined in step S8, i.e., to chip 2, and the position is adjusted, followed by starting the monitoring (step S10). In the monitoring during the development, the wavelength dispersion in the intensity of the reflected light from the monitor region is measured during developing treatment, as in the step of measuring the film thickness of the latent image.

Then, the method of judging the termination of the development (step S11) will now be described on the basis of the intensity change during the actual development. Incidentally, the changes in the intensity of the reflected light are measured simultaneously in respect of a large number of wavelengths, and the method is described in the following on the basis of the intensity having a wavelength of 550 nm.

Figure 19:
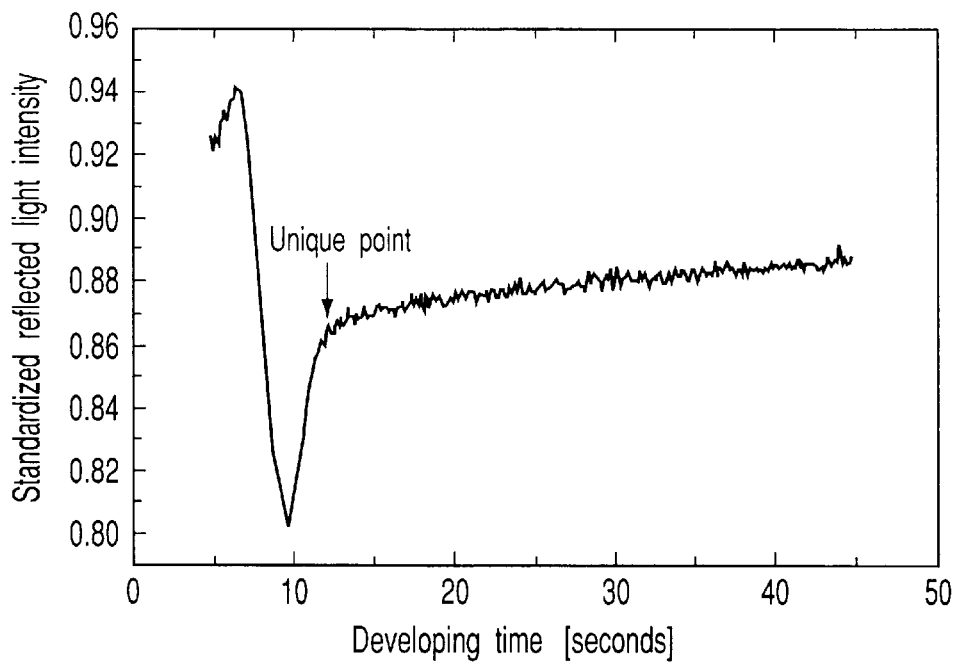
FIG. 19 is a graph showing the relationship between the developing time and the reflected light intensity (wavelength of 550 nm) of the monitor region.

FIG. 19 is a graph showing the experimental data on the relationship between the developing time and the reflectance of the monitor region under the wavelength of 550 nm. The change in the reflectance shown in FIG. 19 supports that an interference change is observed in the initial stage of the development. The unique point, which is observed in the final stage of the interference change, indicates that the thickness reduction of the film in the exposed portion is substantially finished at the unique point. The method of converting the intensity of the reflected light into the phase will now be described, with the phase of the unique point set at 0. Attention is paid to the phase because the phase is a physical amount that is not dependent on the structure of the underlying film and on the wavelength of the probing light.

Figure 20:
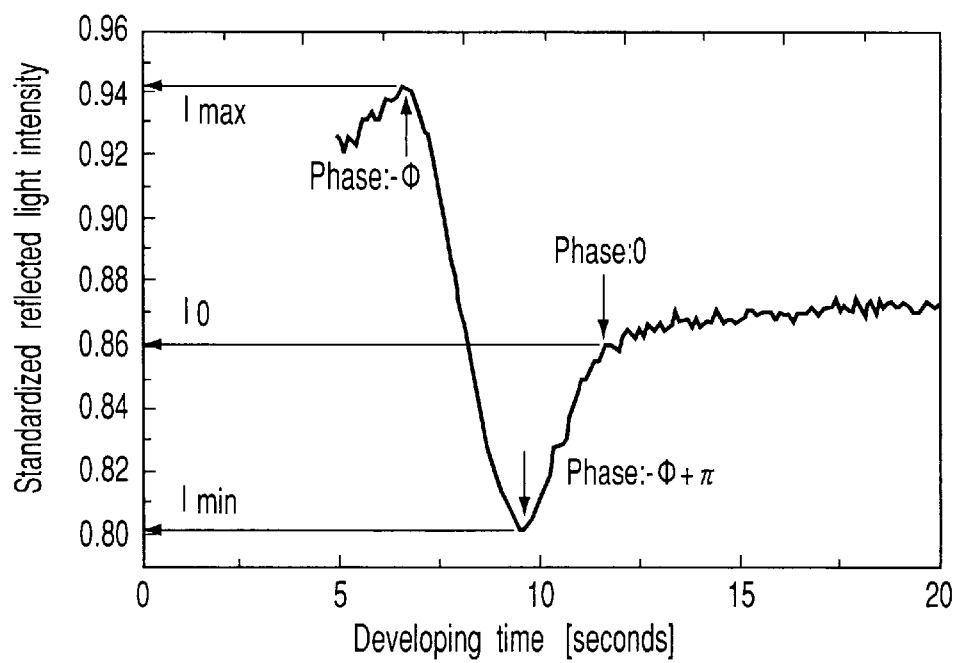
FIG. 20 is a graph showing how the change in the intensity of the reflected light is converted into the phase.

As shown in FIG. 20, the phase at which the change in the intensity is rendered maximal is set at $-\phi$, and the intensity at that time is set at $I_{max}$. Also, the phase at which the change in the intensity is rendered minimal is set at $-\phi+\pi$, and the intensity at that time is set at $I_{min}$. Also, the phases of the unique point is set at 0, and the intensity at that time is set at $I_0$. In this case, the relationship between the intensity I and the phase θ is represented by formulas (1) to (3) given below:

$$I = a\sin(\theta + \varphi) + b \tag{1}$$

$$a = (I_{max} - I_{min})/2 \tag{2}$$

$$b = (I_{max} + I_{min})/2 \tag{3}$$

Figure 21:
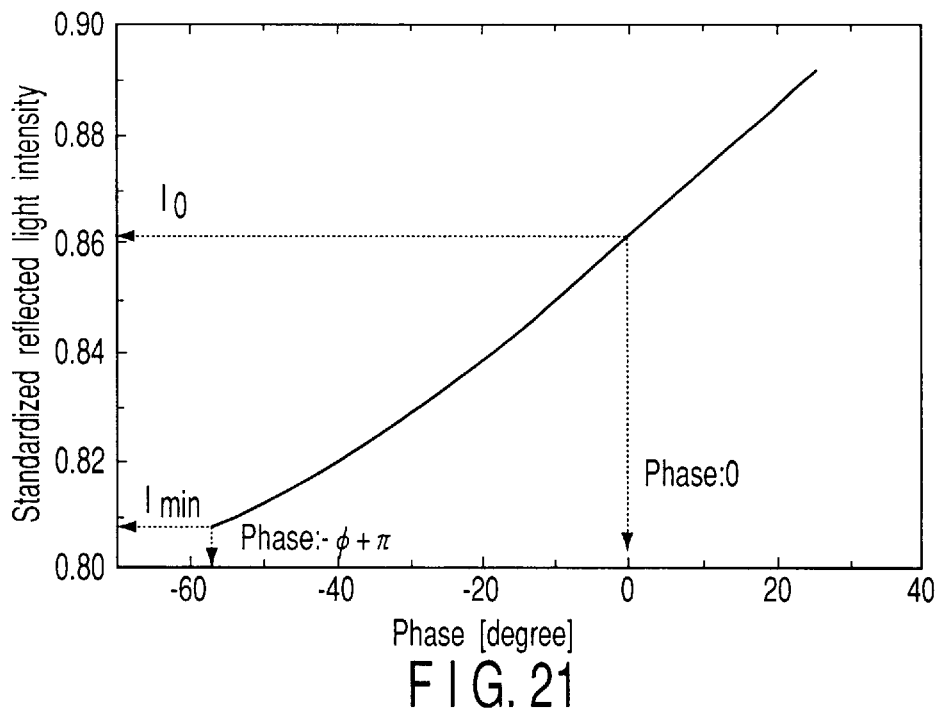
FIG. 21 is a graph showing the relationship between the phase and the standardized reflected light intensity.

As boundary conditions, each of the intensities is calculated by substituting $-\phi$, $-\phi+\pi$ or 0 in θ included in formula (1). AS a result, obtained is a graph showing the relationship between the phase and the reflected light intensity, as shown in FIG. 21. In this fashion, it has been found possible to convert the graph showing the relationship between the reflected light intensity and the developing time into a graph showing the relationship between the reflected light intensity and the phase. The conversion permits improving the accuracy by using a plurality of wavelengths. It follows that it is desirable to perform the conversion by using many wavelengths as far as the analyzing time permits.

Figure 22:
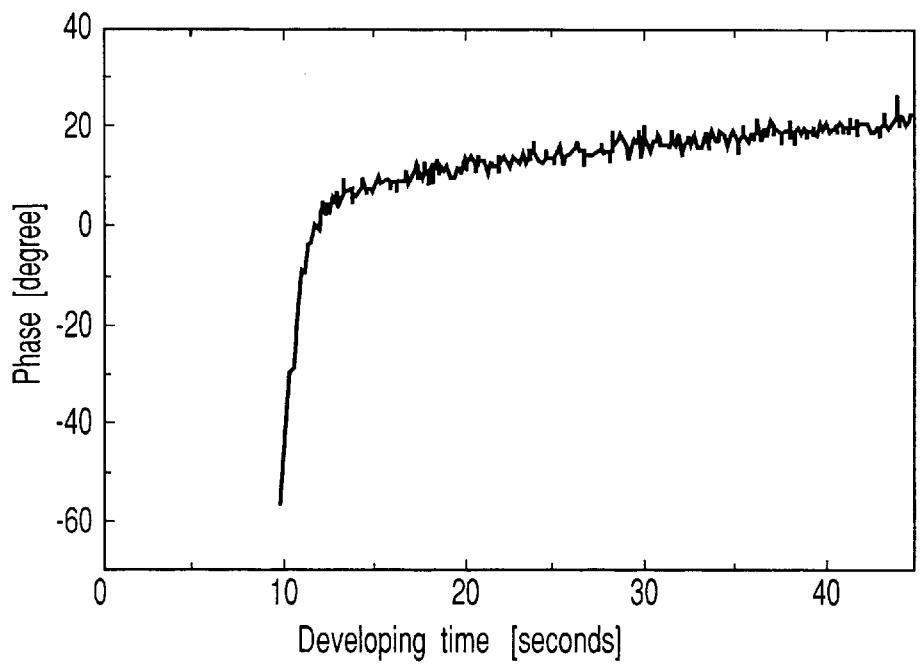
FIG. 22 is a graph showing the relationship between the developing time and the phase.

FIG. 22 is a graph showing the relationship between the developing time and the phase on the basis of the relationship shown in FIG. 21. Since the time when the reflectance of a predetermined wavelength has a predetermined value represents the finishing time in a desired size, the development is finished at the time of the specified phase on the basis of the relationship shown in FIG. 22. Since the reflected light intensity of 0.88 is the intensity finished in a desired size in the case where the measurement is performed at a wavelength 550 nm, the development is finished at the phase of 16.4°. It follows that the development is finished in 30 seconds (step S12).

In the third embodiment, the end point of the development is set at the time when the measured phase has a specified value. However, the present invention is not limited to the particular mode. Also, it is possible to apply the third embodiment to the second embodiment. To be more specific, the end point of the development is obtained in the second embodiment from the time providing the unique point and the reflectance at a predetermined time. However, it is also possible to obtain the end point of the development by substituting the phase for the reflectance in the predetermined time. It is also possible to set two specified times and to obtain the end point of the development from the phase at that time.

(Effect)

According to the third embodiment, in the case where the developing time is controlled in order to reduce the nonuniformity of the size among the wafers, that chip among the wafers which is processed under typical conditions is extracted by the focus information in the light exposure device 36 and by measuring the film thickness of the monitor region. The optimum developing time can be obtained by starting the development and converting the change in the intensity of the monitor region of the chip into the phase so as to greatly reduce the nonuniformity in the size among the wafers, making it possible to markedly improve the accuracy of the size and the yield.

Also, the monitoring can be performed on the basis of the physical amount that is not dependent on the thickness of the underlying layer and on the wavelength of the probing light by substituting the phase for the intensity. It follows that it is possible to eliminate the complex processing of obtaining the size from the wavelength dispersion so as to simplify the analysis.

The present invention is not limited to each of the embodiments described above. In each of the embodiments described above, the chip having average exposure conditions such as the focus and the dose is extracted. However, where the light exposure conditions are aligned for each chip on the wafer, it is not absolutely necessary to employ the step of extracting the chip.

Also, the monitor region is not necessarily limited to the device pattern (i.e., memory cell region in each of the embodiments described above) within the device pattern region. It is possible for the monitor region to be a pattern exclusively for the monitoring. Further, the monitor region is not limited to a region within the device pattern region. It is possible for the monitor region to be formed in a mark region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method of forming a device pattern to a resist film on a to-be-processed substrate by exposing the resist film using a mask including the device pattern and developing the exposed resist film comprising:

exposing the resist film several times by using the mask including a device region and a monitor region in each of a plurality chips of the substrate, in exposing the resist film;

checking a focus value and a dose value of the monitor region of each of the chips between exposing and developing the resist film;

determining a monitor chip exposed within a set focus value and in an average dose value from the chips on the basis of the checked focus value and dose value;

irradiating the monitor region of the monitor chip with light during developing said resist film and estimating the development time when the size of the device pattern has reached a desired value on the basis of the intensity change of the reflected light of the monitor region; and supplying a solution onto said substrate in the estimated development time so as to stop the development.

2. A pattern forming method of forming a device pattern to a resist film on a to-be-processed substrate by exposing the resist film using a mask including the device pattern and developing the exposed resist film comprising:

exposing the resist film several times by using the mask including a device region and a monitor region in each of a plurality of chips of the substrate, in exposing the resist film;

irradiating said monitor region with light having a plurality of wavelengths during developing said resist film and estimating the development time when the size of the device pattern has reached a desired value on the basis of the wavelength dispersion in the intensity of the reflected light of the monitor region; and supplying a solution onto said substrate during the estimated development time so as to stop the development.

3. A pattern forming method of forming a device pattern to a resist film on a to-be-processed substrate by exposing the resist film using a mask including the device pattern and developing the exposed resist film comprising:

exposing the resist film several times by using the mask including a device region and a monitor region in each of a plurality of chips of the substrate, in exposing the resist film;

irradiating the monitor region with a light having a plurality of wavelengths during developing said resist film, converting a change in an intensity of the reflected light of the monitor region into a change in a phase, and estimating the development time when the size of the device pattern has reached a desired value on the basis of the converted phase; and supplying a solution onto said substrate in the estimated development time so as to stop the development.

4. The pattern forming method according to claim 1, wherein said monitor region is a memory cell region in the device pattern.

5. The pattern forming method according to claim 2, wherein said monitor region is a memory cell region in the device pattern.

6. The pattern forming method according to claim 3, wherein said monitor region is a memory cell region in the device pattern.

7. The pattern forming method according to claim 1, wherein the checked focus value is derived from the information of the flatness of the substrate measured in a leveling process in an exposure device.

8. The pattern forming method according to claim 1, wherein, the checked dose value is derived from the wavelength dispersion in the intensity of the reflected light of the monitor region.

9. The pattern forming method according to claim 1, wherein the checked dose value is derived from a depth of a latent image of the monitor region.

10. The pattern forming method according to claim 2, wherein, in estimating the development time, the monitor region is irradiated with light having a plurality of wavelengths, and the development time is estimated from the time providing a unique point in the change in the intensity of the reflected light from said monitor region and from the focus value of the monitor region obtained from the exposure device.

11. The pattern forming method according to claim 2, wherein, in estimating the development time, the monitor region is irradiated with light having a plurality of wavelengths and the development time is estimated from the reflectance in a predetermined time in the change in the intensity of the reflected light from the monitor region.

12. The pattern forming method according to claim 2, wherein, in estimating the development time, the monitor region is irradiated with light having a plurality of wavelengths, and the development time is estimated on the basis of the reflectance in a predetermined time in the change of the intensity of the reflected light reflected from the monitor region and the focus value of the monitor region obtained from the exposure device.

13. The pattern forming method according to claim 2, wherein, in estimating the development time, the monitor region is irradiated with light having a plurality of wavelengths, and the development time is estimated on the basis of the reflectance in a predetermined time in the change of the intensity of the reflected light reflected from the monitor region and the time providing a unique point in the change of the intensity of the reflected light.

14. The pattern forming method according to claim 13, wherein the treatment to obtain the predetermined time in the change of the intensity of the reflected light reflected from the monitor region and the treatment to obtain the time providing the unique point in the change of the intensity of the reflected light are carried out in different time zones during the development.

15. The pattern forming method according to claim 2, wherein said monitor region is irradiated with light having the plurality of wavelengths, and the development time is estimated from the amount of change in the reflectance.

16. The pattern forming method according to claim 2, wherein in estimating the development time, said monitor region is irradiated with light having the plurality of wavelengths, and the development time is estimated from the amount of change in the reflectance in a predetermined time in the change of the intensity of the reflected light reflected from said monitor region and from the time providing a unique point in the change of the intensity of the reflected light.

17. The pattern forming method according to claim 16, wherein the treatment to obtain the predetermined time in the change in the intensity of the reflected light from the monitor region and the treatment to obtain the time providing the unique point in the change of the intensity of the reflected light are carried out in different time zones during the development.

18. The pattern forming method according to claim 3, wherein, in estimating the development time, the monitor region is irradiated with light having the plurality of wavelengths, the change in the intensity of the reflected light from the monitor region is converted into the change in the phase, and the development is stopped when the phase has reached a desired value.

19. The pattern forming method according to claim 3, wherein, in estimating the development time, the monitor region is irradiated with light having the plurality of wavelengths, the change in the intensity of the reflected light from the monitor region is converted into the change in the phase, and the development time is estimated from the phase at a predetermined time.

20. The pattern forming method according to claim 3, wherein, in estimating the development time, the monitor region is irradiated with light having the plurality of wavelengths, the change in the intensity of the reflected light from the monitor region is converted into the change in the phase, and the development time is estimated from the phases at a plurality of time zones.

21. The pattern forming method according to claim 3, wherein, in estimating the development time, the monitor region is irradiated with light having the plurality of wavelengths, the change in the intensity of the reflected light from the monitor region is converted into the change in the phase, and the development time is estimated from the phase at a predetermined time and the time when the phase becomes 0.

22. A pattern position detecting method of detecting the position of a monitor region of a resist pattern intermediate between exposing and developing, wherein the position of the monitor region of said resist pattern is detected by using the arranging information of a lower layer pattern of the resist pattern on the basis of the result of detection of the position of said lower layer pattern and the positional relationship between said monitor region of said resist pattern and the lower layer pattern.

23. A pattern forming method of forming a device pattern to a resist film on a to-be-processed substrate by exposing the resist film using a mask including the device pattern and developing the exposed resist film comprising:

exposing the resist film several times by using the mask including a device region and a monitor region in each of a plurality of chips of the substrate, in exposing the resist film;

checking a focus value and a dose value of the monitor region of each of the chips between exposing and developing the resist film, the checked focus value being derived from the information of the flatness of the substrate measured in a leveling process in an exposure device, the checked dose value being derived from the wavelength dispersion in the intensity of the reflected light of the monitor region;

determining a monitor chip exposed within a set focus value and in an average dose value from the chips on the basis of the checked focus value and dose value;

irradiating the monitor region of the monitor chip with light during developing said resist film and estimating the development time when the size of the device pattern has reached a desired value on the basis of the intensity change of the reflected light of the monitor region; and supplying a solution onto said substrate in the estimated development time so as to stop the development.

* * * * *